United States Patent
Acosta (10) Patent No.: US 10,951,018 B2
(45) Date of Patent: Mar. 16, 2021

(54) GROUND FAULT CURRENT INTERRUPTER CIRCUIT

(71) Applicant: TEXAS INSTRUMENTS INCORPORATED, Dallas, TX (US)

(72) Inventor: Julio E. Acosta, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 254 days.

(21) Appl. No.: 16/131,739

(22) Filed: Sep. 14, 2018

(65) Prior Publication Data

US 2019/0148930 A1    May 16, 2019

Related U.S. Application Data (60) Provisional application No. 62/586,307, filed on Nov. 15, 2017.

(51) Int. Cl.
*H02H 3/16*    (2006.01)
*H03K 5/24*    (2006.01)
(Continued)

(52) U.S. Cl.
CPC .......... *H02H 3/165* (2013.01); *H02H 1/0007* (2013.01); *H02H 3/33* (2013.01); *H02H 3/331* (2013.01); *H03K 5/24* (2013.01)

(58) Field of Classification Search
CPC .......... H02H 3/16; H02H 3/165; H02H 3/26; H02H 3/32; H02H 3/33; H02H 3/331; H02H 1/007; H03K 5/24

See application file for complete search history.

(56) References Cited

U.S. PATENT DOCUMENTS 5,559,687 A    9/1996    Nicollini et al.
5,600,524 A *  2/1997    Neiger ............... H02H 3/335
                                                   361/115
(Continued)

FOREIGN PATENT DOCUMENTS

JP    H1094161    4/1998
RU    2169422     6/2001

OTHER PUBLICATIONS

International Search Report in corresponding PCT application No. PCT/US2018/061235, dated Mar. 7, 2019 (2 pages).
(Continued)

*Primary Examiner* — Adolf D Berhane
(74) *Attorney, Agent, or Firm* — John R. Pessetto; Charles A. Brill; Frank D. Cimino (57) ABSTRACT

A ground fault current interrupter circuit includes a plurality of comparators, threshold generation circuitry, and a plurality of timer circuits. Each of the comparators is configured to compare a threshold voltage to a signal representative of a difference of current flow to a load and current flow from the load. The threshold generation circuitry is configured to generate a plurality of different threshold voltages. Each of the different threshold voltages is provided as the threshold voltage for one of the comparators. Each of the comparators is coupled to one of the timer circuits, and the one of the timer circuits is configured to activate a fault signal responsive to activation of an output of the comparator for a time that is related to the threshold voltage provided to the comparator. The time increases with lower values of the threshold voltage.

14 Claims, 4 Drawing Sheets

(51) Int. Cl.
 *H02H 1/00* (2006.01)
 *H02H 3/33* (2006.01)

(56) References Cited

U.S. PATENT DOCUMENTS

| | | | | |
|---|---|---|---|---|
| 5,856,902 | A | 1/1999 | Hashimoto et al. | |
| 5,946,173 | A * | 8/1999 | Packard | H02H 3/33 |
| | | | | 361/42 |
| 2010/0290164 | A1* | 11/2010 | Kinsel | H02H 3/331 |
| | | | | 361/45 |
| 2011/0080177 | A1* | 4/2011 | Beck | G01R 15/18 |
| | | | | 324/509 |
| 2012/0146655 | A1 | 6/2012 | Suchoff | |
| 2013/0120882 | A1* | 5/2013 | Love | H02H 3/162 |
| | | | | 361/42 |
| 2014/0285927 | A1* | 9/2014 | Leung | H01H 83/144 |
| | | | | 361/42 |
| 2017/0285087 | A1 | 10/2017 | Onishi | |
| 2017/0288390 | A1 | 10/2017 | Hashimoto | |

OTHER PUBLICATIONS

Supplementary European Search Report in corresponding EP Patent Application No. EP18879150, dated Dec. 23, 2020 (7 pages).

* cited by examiner

GROUND FAULT CURRENT INTERRUPTER CIRCUIT

CROSS-REFERENCE TO RELATED APPLICATIONS

The present application claims priority to U.S. Provisional Patent Application No. 62/586,307, filed Nov. 15, 2017, titled "GFCI Fault Adjusted Voter for the Prevention of Non-Real/Nuisance Faults," which is hereby incorporated herein by reference in its entirety.

BACKGROUND

Electrical power distribution typically includes multiple conductor wires to transmit electrical energy and provide a ground path for safety. A shock hazard exists in the event of an unintended path from the conductor wires or surfaces (such as a chassis of electrical equipment), which carry electric current, and the ground path. The conductors, such as a line conductor (also referred to as "hot") and a neutral, or common, conductor, may leak electrical current to each other, to ground, and/or to a person or object as an intermediate path to ground.

Ground fault current interrupters (GFCIs) may minimize and/or eliminate the risk of electrical shock by monitoring an imbalance of electrical current between the hot and neutral lines. If an imbalance is detected, the GFCI may physically isolate the hot and the neutral conductors from the load.

SUMMARY

A ground fault current interrupter (GFCI) circuit that trips based on the time that a fault is present relative to the magnitude of the fault is disclosed herein. Quicker tripping is provided for higher magnitude faults, while lower magnitude faults must be present for a longer time to avoid nuisance trips. In one example, a GFCI circuit includes a plurality of comparators, threshold generation circuitry, and a plurality of timer circuits. Each of the comparators is configured to compare a threshold voltage to a signal representative of a difference of current flow to a load and current flow from the load. The threshold generation circuitry is configured to generate a plurality of different threshold voltages. Each of the different threshold voltages is provided as the threshold voltage for one of the comparators. Each of the comparators is coupled to one of the timer circuits, and the one of the timer circuits is configured to activate a fault signal responsive to activation of an output of the comparator for a time that is related to the threshold voltage provided to the comparator. The time increases with lower values of the threshold voltage.

In another example, a method for ground fault current interruption includes comparing a signal representative of a difference of current flow to a load and current flow from the load to a plurality of threshold voltages. Each of the threshold voltages corresponds to a different value of the difference of current flow. A fault signal is activated responsive to determining that, for at least one of the threshold voltages, the signal representative of the difference of current flow exceeds the at least one of the threshold voltages in at least half of a predetermined number of previous alternating current cycles.

In a further example, a GFCI circuit includes a plurality of comparators, threshold generation circuitry, and a plurality of timer circuits. Each of the comparators is configured to compare a threshold voltage to a signal representative of a difference of current flow to a load and current flow from the load. The threshold generation circuitry is configured to generate a plurality of different threshold voltages. Each of the different threshold voltages is provided as the threshold voltage for one of the comparators. Each of the timer circuits includes a filter counter that is coupled to one of the comparators, and a cycle counter that is coupled to the filter counter. The filter counter is configured to activate a filter output signal responsive to the output of the comparator being active for longer that a predetermined time. The predetermined time increases with lower values of the threshold voltage. The phase counter is configured to trigger a fault signal based on the filter output signal being active in more than half of a predetermined number of previous alternating current cycles.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

A ground fault current interrupter (GFCI) detects a difference in the current flowing in a hot conductor and a neutral conductor, and opens the circuit if the difference exceeds a threshold. While it is important for the GFCI to detect fault conditions, it is also desirable to avoid false detections that cause the circuit to be opened unnecessarily, i.e., nuisance trips. Some GFCI implementations apply a single trip threshold with a filter to reduce nuisance trips. Such implementations still produce a substantial number of nuisance trips. Nuisance trips can be caused by noise on the power conductors resulting from motors, generators, switches, etc. coupled to the power lines.

The GFCI circuit disclosed herein detects ground faults while reducing the number of nuisance trips. The GFCI circuit compares a difference in current flow in the hot and neutral conductors to multiple thresholds. The different thresholds define ranges of current difference. In each range of current difference, the current difference is identified as a fault only if the current difference is present for a predetermined time. The time is different for each current difference range. For example, the time is shorter for a higher current difference range and the time is longer for a lower current difference range. Thus, a smaller current difference must be present for a longer time than a larger current difference to trigger opening of the circuit. By applying longer time intervals for detection of a fault with a lower current difference, implementations of the GFCI circuit disclosed herein substantially reduce nuisance trips without compromising ground fault detection.

Figure 1:
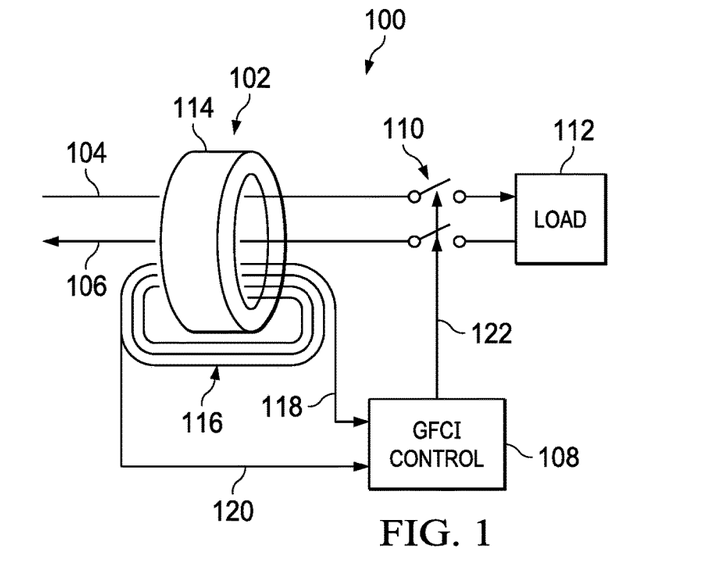
FIG. 1 shows a schematic diagram for an example of a circuit that includes a ground fault current interrupter (GFCI) circuit in accordance with the present disclosure.

FIG. 1 shows a schematic diagram for an example of a ground fault monitoring circuit 100 that includes a GFCI circuit in accordance with the present disclosure. The ground fault monitoring circuit 100 includes a current transformer 102, a GFCI circuit 108, and a switch 110. A hot conductor 104 and a neutral conductor 106 pass through a core 114 of the current transformer 102. An imbalance (i.e., a difference) in the currents flowing in the hot conductor 104 and the neutral conductor 106 produces a current in the secondary winding 116 of the current transformer 102. The GFCI circuit 108 is coupled to current transformer 102 via secondary leads 118 and 120, and monitors the current flowing in the secondary winding 116. If the current flowing in the secondary winding 116 indicates an imbalance indicative of a ground fault, then the GFCI circuit 108 asserts the switch control signal 122 to open the switch 110 and disconnect the load 112 from the hot conductor 104 and the neutral conductor 106.

To prevent opening of the switch 110, and disconnection of power from the load 112, in situations where a fault is unlikely, the GFCI circuit 108 detects faults based on ranges of current imbalance detected. That is, if the current imbalance detected by the current transformer 102 is small, then the GFCI circuit 108 requires the imbalance be present for a relatively long time before the GFCI circuit 108 deems a fault to be present and opens the switch 110. Similarly, if the current imbalance detected by the current transformer 102 is large, then the GFCI circuit 108 requires the imbalance be present for a relatively short time before the GFCI circuit 108 deems a fault to be present and opens the switch 110. In this way, the GFCI circuit 108 reduces the number of nuisance trips that result from transients in the hot conductor 104 and neutral conductor 106.

Figure 2:
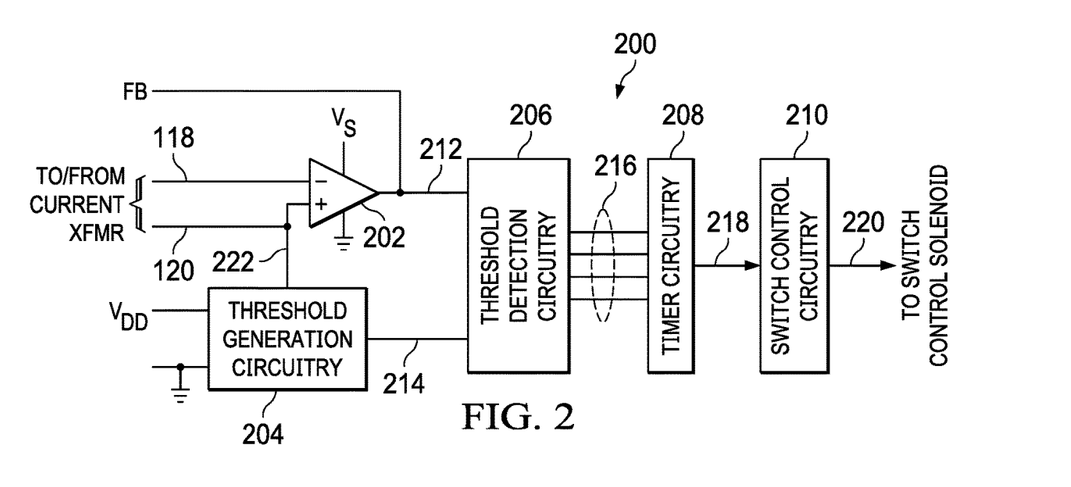
FIG. 2 shows a block diagram for a GFCI circuit in accordance with the present disclosure.

FIG. 2 shows a block diagram for a GFCI circuit 200 in accordance with the present disclosure. The GFCI circuit 200 is an implementation of the GFCI circuit 108. The GFCI circuit 200 includes an amplifier 202, threshold generation circuitry 204, threshold detection circuitry 206, timer circuitry 208, and switch control circuitry 210. The amplifier 202 converts the current flowing the secondary winding 116 of the current transformer 102 to a voltage. Inputs of the amplifier 202 are coupled to the secondary winding 116 of the current transformer 102 via the lead 118 and the lead 120. In some implementations of the ground fault monitoring circuit 100, the lead 118 is coupled to the inverting input of the amplifier 202 via a resistor, and the output signal 212 produced by the amplifier 202 is fed back to the inverting input of the amplifier 202 via a resistor. The output signal 212 is proportional to the current flowing in the secondary winding 116, and is provided to the threshold detection circuitry 206 for use in detecting a ground fault.

The threshold generation circuitry 204 includes circuitry to generate threshold voltages 214 that are used by the threshold detection circuitry 206 to define a plurality of ranges. The number of threshold voltages 214 generated by the threshold generation circuitry 204 is different in different implementations of the GFCI circuit 200. For example, one implementation of the threshold generation circuitry 204 produces eight threshold voltages 214, where four threshold voltages 214 represent different levels of positive current imbalance and four threshold voltages 214 represent different levels of negative current imbalance. Other implementations of the threshold generation circuitry 204 produce a different number of threshold voltages. Implementations of the threshold generation circuitry 204 also include reference generation circuitry that produces a reference voltage 222 that is provided to the lead 120 to set a reference voltage at the non-inverting input of the amplifier 202. Some implementations of the threshold generation circuitry 204 include voltage reference circuitry, resistive voltage dividers, and/or other circuitry to generate the threshold voltages 214 and the reference voltage 222.

Figure 3:
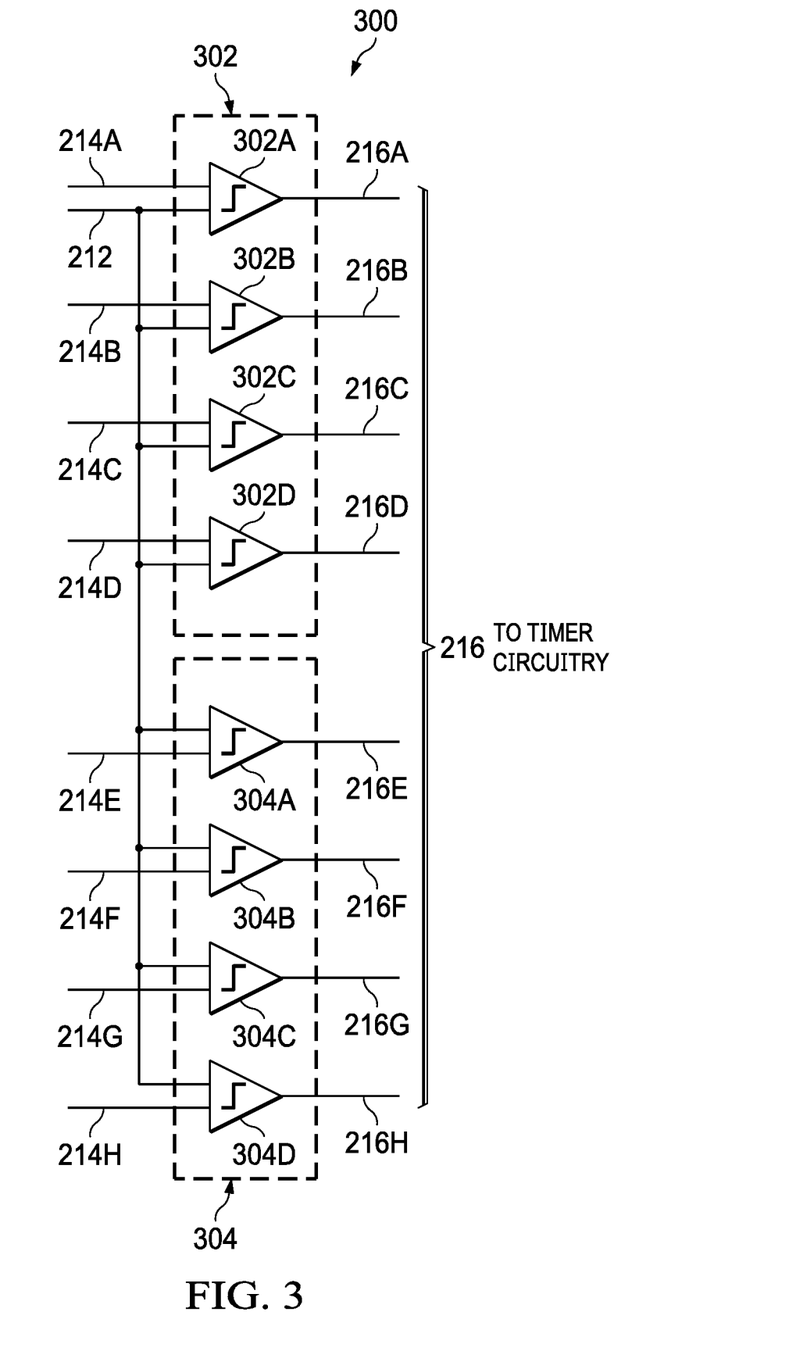
FIG. 3 shows a block diagram for threshold detection circuitry suitable for use in a GFCI circuit in accordance with the present disclosure.

The threshold detection circuitry 206 compares the output signal 212 received from the amplifier 202 to the threshold voltages 214 received from the threshold generation circuitry 204. FIG. 3 shows a block diagram for threshold detection circuitry 300 suitable for use in a GFCI circuit in accordance with the present disclosure. The threshold detection circuitry 300 is an implementation of the threshold detection circuitry 206. The threshold detection circuitry 300 includes positive comparators 302 and negative comparators 304. In the implementation of the threshold detection circuitry 300 illustrated in FIG. 3, the positive comparators 302 include four comparators: comparator 302A, comparator 302B, comparator 302C, and comparator 302D. Similarly, the negative comparators 304 include four comparators: comparator 304A, comparator 304B, comparator 304C, and comparator 304D. Some implementations of the threshold detection circuitry 300 include a different number of comparators. Each of the positive comparators 302 compares the output signal 212 to one of the threshold voltages 214 provided by the threshold generation circuitry 204. The comparator 302A compares the output signal 212 to the threshold voltage 214A, the comparator 302B compares the output signal 212 to the threshold voltage 214B, the comparator 302C compares the output signal 212 to the threshold voltage 214C, and the comparator 302D compares the output signal 212 to the threshold voltage 214D. Each of the threshold voltages 214 represents a different current flow in the secondary winding 116. For example, in some implementations of the threshold detection circuitry 300, the threshold voltage 214A represents +5 milliamperes (ma) of current flow, the threshold voltage 214B represents +20 ma of current flow, the threshold voltage 214C represents +40 ma of current flow, and the threshold voltage 214D represents +100 ma of current flow. The threshold voltages 214 represent different values of current flow in some implementations. The comparator 302A generates output signal 216A that indicates whether the output signal 212 exceeds the threshold voltage 214A. The comparator 302B generates output signal 216B that indicates whether the output signal 212 exceeds the threshold voltage 214B. The comparator 302C generates output signal 216C that indicates whether the output signal 212 exceeds the threshold voltage 214C.

The comparator 302D generates output signal 216D that indicates whether the output signal 212 exceeds the threshold voltage 214D.

Like the positive comparators 302, each of the negative comparators 304 compares the output signal 212 to one of the threshold voltages 214 provided by the threshold generation circuitry 204. The comparator 304A compares the output signal 212 to the threshold voltage 214E, the comparator 304B compares the output signal 212 to the threshold voltage 214F, the comparator 304C compares the output signal 212 to the threshold voltage 214G, and the comparator 304D compares the output signal 212 to the threshold voltage 214H. In some implementations, the threshold voltage 214E represents −5 milliamperes (ma) of current flow, the threshold voltage 214F represents −20 ma of current flow, the threshold voltage 214G represents −40 ma of current flow, and the threshold voltage 214H represents −100 ma of current flow. The threshold voltages 214 represent different values of current flow in some implementations. The comparator 304A generates output signal 216E that indicates whether the output signal 212 exceeds the threshold voltage 214E. The comparator 304B generates output signal 216F that indicates whether the output signal 212 exceeds the threshold voltage 214F. The comparator 304C generates output signal 216G that indicates whether the output signal 212 exceeds the threshold voltage 214G. The comparator 304D generates output signal 216H that indicates whether the output signal 212 exceeds the threshold voltage 214H.

The outputs 216 of the threshold detection circuitry 206 are provided to the timer circuitry 208. The timer circuitry 208 applies the outputs 216 to measure the time that the current imbalance represented by the output signal 212 exceeds each of the threshold voltages 214. A time value is associated with each of the threshold voltages 214. The lower the threshold voltage 214, the higher the time value.

Figure 4:
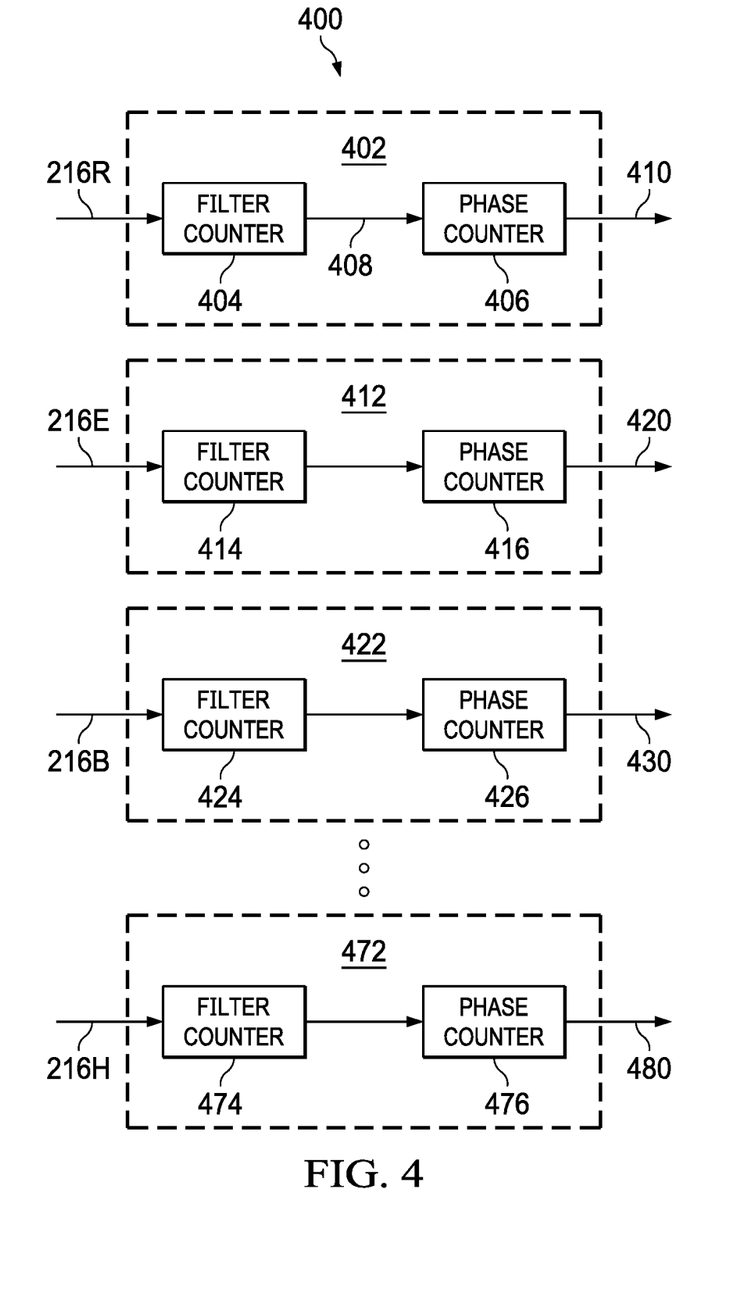
FIG. 4 shows a block diagram for timer circuitry suitable for use in a GFCI circuit in accordance with the present disclosure.

FIG. 4 shows a block diagram for timer circuitry 400 suitable for use in a GFCI circuit in accordance with the present disclosure. The timer circuitry 400 is an implementation of the timer circuitry 208. The timer circuitry 400 includes a number of timer circuits, and each comparator 302 and 304 is coupled to one of the timer circuits. The implementation of the timer circuitry 400 shown in FIG. 4 includes timer circuit 402, timer circuit 412, timer circuit 422, and timer circuit 472. Referencing the comparator circuitry of FIG. 3, the timer circuit timer circuit 402 is coupled to comparator 302A, the timer circuit 412 is coupled to comparator 304A, the timer circuit 422 is coupled to comparator 302B, and the timer circuit 472 is coupled to comparator 304D. The timer circuitry 400 includes additional timer circuits (not shown in FIG. 4), each of which is coupled to one of the comparators 302C, 302D, 304B, or 304C. Some implementations of the timer circuitry 400 include a different number of timer circuits to accommodate a different number of comparators.

Each of the timer circuits includes a filter counter and a phase counter. The phase counter is coupled to the filter counter. Operation of the timer circuits will be described with regard to the timer circuit 402. The timer circuit 402 includes filter counter 404 and phase counter 406. The filter counter 404 counts a number of sequential clock cycles that the output signal 216A generated by the comparator 302A is active. For example, if the filter counter 404 is clocked by a 1 megahertz clock signal, then the filter counter 404 counts the number of microseconds that the output signal 216A is continuously active. If the output signal 216A is continuously active for at least a predetermined time, then the filter counter 404 activates filter output signal 408. Thus, the filter counter 404 filters the output signal 216A to insure that the output signal 216A is continuously active for at least the predetermined time to be considered a ground fault.

The phase counter 406 is activated when the filter counter 404 asserts the filter output signal 408. The phase counter 406 counts a number of sequential cycles of the alternating current (AC) power signal flowing in the hot conductor 104 and the neutral conductor 106 during which the filter output signal 408 is active. If the filter output signal 408 is active for at least one-half of a predetermined number of previous AC cycles, then the phase counter 406 activates the fault signal 410, which indicates that that a ground fault has been detected.

The timer circuit 412, the timer circuit 422, and the timer circuit 472 operate similarly to the timer circuit 402. The timer circuit 412 includes filter counter 414 and phase counter 416. The timer circuit 422 includes filter counter 424 and phase counter 426. The timer circuit 472 includes filter counter 474 and phase counter 476. The predetermined time associated with each of the filter counters and the predetermined number of AC cycles associated with each of the phase counters is different. Higher predetermined time values and higher predetermined AC cycle values are assigned to filter counters and phase counters coupled to comparators operating with lower threshold voltages. Table 1 below shows an example of the predetermined time values and the predetermined cycle count values applied in the timer circuits 402, 412, 422, and 432. Some implementations of the timer circuitry 400 apply different predetermined time values and the predetermined cycle count values.

TABLE 1

| Comparator Outputs | Filter Counter Time | Phase Counter Cycles | Current |
|---|---|---|---|
| 216A | 512 us | 64 | 5 ma |
| 216E | 512 us | 64 | 5 ma |
| 216B | 64 us | 16 | 20 ma |
| 216F | 64 us | 16 | 20 ma |
| 216C | 32 us | 4 | 40 ma |
| 216G | 32 us | 4 | 40 ma |
| 216D | 16 us | 2 | 100 ma |
| 216H | 16 us | 2 | 100 ma |

If any of the phase counters phase counter 406, 416, 426, or 436 of the timer circuitry 400 counts the predetermined number of cycles, then the phase counter generates a fault signal fault signal 410, 420, 430, or 440 indicating that a ground fault has been detected. In FIG. 2, a fault signal 218 represents the combined fault signals fault signals 410, 420, 430, and 440 (e.g., the logical-OR of the fault signals). The switch control circuitry 210 receives the fault signal 218 and generates a signal to open the switch 110 and disable current flow to the load 112. For example, in some implementations of the ground fault monitoring circuit 100, the switch 110 is controlled by a solenoid or other actuator that is in turn controlled by a silicon controlled rectifier (SCR). The switch control circuitry 210 generates a signal to trigger the SCR, which activates the solenoid and opens the switch 110.

Figure 5:
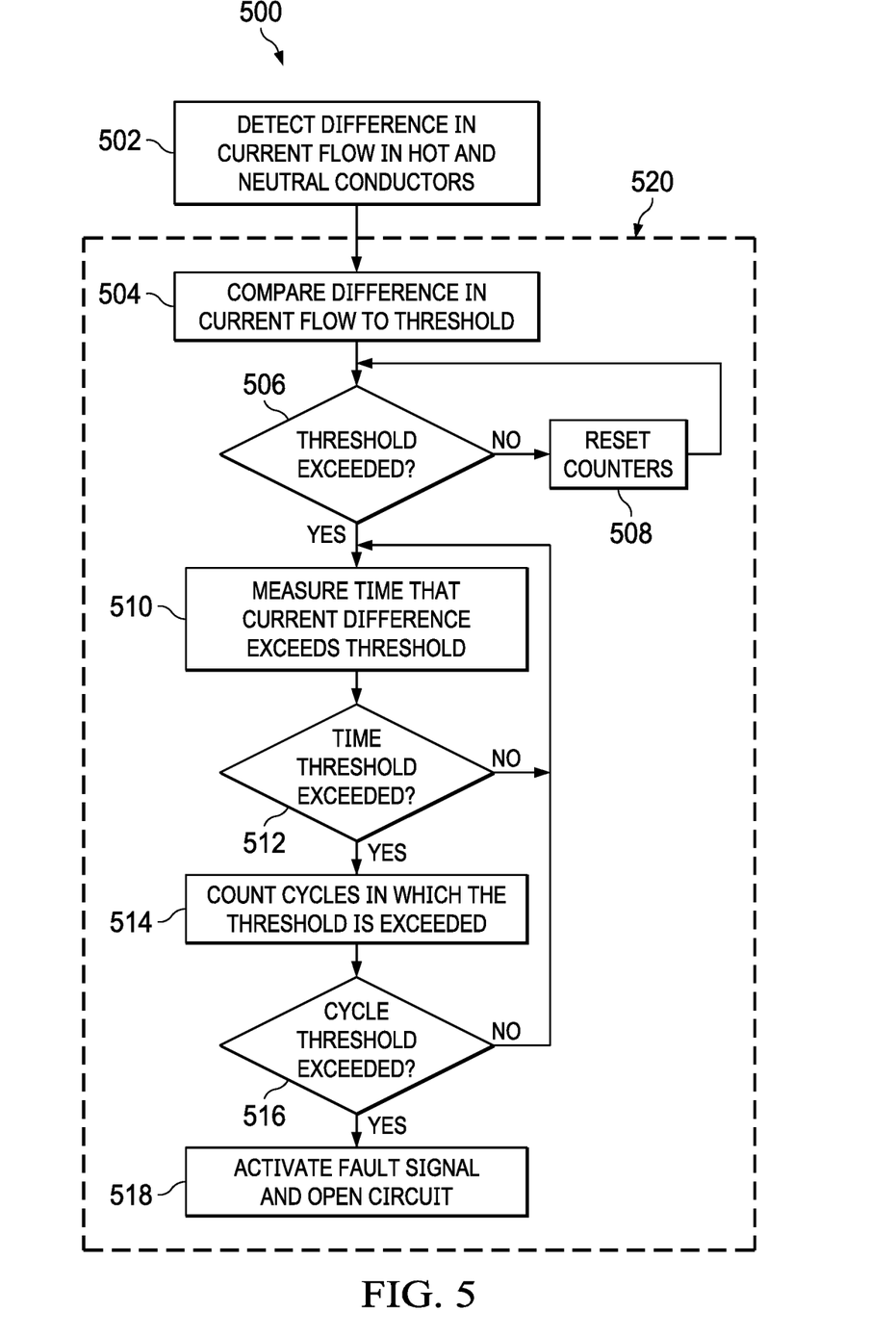
FIG. 5 shows a flow diagram for a method for ground fault current interruption in accordance with the present disclosure.

FIG. 5 shows a flow diagram for a method 500 for ground fault current interruption in accordance with the present disclosure. Though depicted sequentially as a matter of convenience, at least some of the actions shown can be performed in a different order and/or performed in parallel. Additionally, some implementations perform only some of the actions shown. Operations of the method 500 are performed by ground fault monitoring circuit 100.

In block 502, the current transformer 102 generates a current in the secondary winding 116 that is proportional to the difference in current flowing in the hot conductor 104 and current flowing in the neutral conductor 106. The amplifier 202 amplifies the detected current difference, and provides the output signal 212 to the threshold detection circuitry 206. The operation of block 502 is performed in parallel with other operations of the method 500 in some implementations.

The operations 520 are performed for each current threshold applied to detect a ground fault. For example, if the GFCI circuit 200 includes eight comparators 302, 304 and eight corresponding thresholds, then the operations 520 are discretely performed for each of the eight thresholds.

In block 504, the threshold detection circuitry 206 compares the output signal 212 to a given one of the threshold voltage 214 generated by the threshold generation circuitry 204. Each of the threshold voltages 214 represents a different value of current difference. The operation of block 504 is performed in parallel with other operations of the method 500 in some implementations.

In block 506, if the output signal 212 does not exceed the threshold voltage 214, then, in block 508, the counters of the timer circuitry 208 associated with the threshold voltage are reset.

If, in block 506, the output signal 212 exceeds the threshold voltage 214, then, in block 510, the timer circuitry 208 measures the time that the output signal 212 exceeds the threshold voltage 214. If, in block 512, the time that the output signal 212 exceeds the threshold voltages 214 is greater than a predetermined time corresponding to the threshold voltage 214, then, in block 514, the timer circuitry 208 counts the number of sequential AC cycles present on the hot conductor 104 or neutral conductor 106 during which the output signal 212 exceeds the threshold voltage 214.

If, in block 516, the number of sequential AC cycles present on the hot conductor 104 or neutral conductor 106 during which the output signal 212 exceeds the threshold voltages 214 is greater than one-half of a predetermined number of cycles, then, in block 518, the GFCI circuit 108 activates a fault signal that opens the switch 110. In some implementations, the GFCI circuit 108 also activates a signal that, for example, notifies a user that a ground fault has been detected.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A ground fault current interrupter (GFCI) circuit, comprising:
   a plurality of comparators, each of the comparators configured to compare a threshold voltage to a signal representative of a difference of current flow to a load and current flow from the load;
   threshold generation circuitry configured to generate a plurality of different threshold voltages, each of the different threshold voltages provided as the threshold voltage for one of the comparators;
   a plurality of timer circuits, wherein each of the comparators is coupled to one of the timer circuits, and each of the timer circuits is configured to activate a fault signal responsive to activation of an output of the comparator coupled to the timer circuit for a time that is related to the threshold voltage provided to the comparator; wherein the time increases with lower values of the threshold voltage.

2. The GFCI circuit of claim 1, wherein each of the timer circuits comprises a filter counter coupled to one the comparators, the filter counter configured to activate a filter output signal responsive to the output of the comparator being active for longer that a predetermined time; wherein the predetermined time increases with lower values of the threshold voltage.

3. The GFCI circuit of claim 2, wherein each of the timer circuits comprises a phase counter coupled to the filter counter, the phase counter configured to trigger the fault signal based on the filter output signal being active in more than half of a predetermined number of previous alternating current cycles.

4. The GFCI circuit of claim 3, wherein the predetermined number increases with lower values of the threshold voltage.

5. The GFCI circuit of claim 1, wherein:
   a first of the threshold voltages corresponds to 5 milliamperes (ma) of difference of current flow to the load and current flow from the load;
   a second of the threshold voltages corresponds to 20 ma of difference of current flow to the load and current flow from the load;
   a third of the threshold voltages corresponds to 40 ma of difference of current flow to the load and current flow from the load; and
   a fourth of the threshold voltages corresponds to 100 ma of difference of current flow to the load and current flow from the load.

6. The GFCI circuit of claim 1, further comprising an amplifier comprising an output coupled each of the comparators.

7. The GFCI circuit of claim 6, further comprising a current transformer coupled to the amplifier, and configured to detect the difference of current flow to the load and current flow from the load.

8. The GFCI circuit of claim 1, further comprising a switch coupled to the timer circuit, the switch configured to interrupt the current flow to the load responsive to activation of the fault signal.

9. A method for ground fault current interruption, comprising:
   comparing a signal representative of a difference of current flow to a load and current flow from the load to a plurality of threshold voltages; wherein each of the threshold voltages corresponds to a different value of the difference of current flow; and
   activating a fault signal responsive to determining that, for at least one of the threshold voltages, the signal representative of the difference of current flow exceeds the at least one of the threshold voltages in at least half of a predetermined number of previous alternating current cycles;
   wherein the predetermined number increases with lower values of the threshold voltages.

10. A method for ground fault current interruption, comprising:
    comparing a signal representative of a difference of current flow to a load and current flow from the load to a plurality of threshold voltages; wherein each of the threshold voltages corresponds to a different value of the difference of current flow; and
    activating a fault signal responsive to determining that, for at least one of the threshold voltages, the signal representative of the difference of current flow exceeds the at least one of the threshold voltages in at least half of a predetermined number of previous alternating current cycles;

wherein:

a first of the threshold voltages corresponds to a difference of current flow of 5 ma and the predetermined number of previous alternating current cycles is at least 64;

a second of the threshold voltages corresponds to a difference of current flow of 20 ma and the predetermined number of previous alternating current cycles is at least 16;

a third of the threshold voltages corresponds to a difference of current flow of 40 ma and the predetermined number of previous alternating current cycles is at least 4; and a fourth of the threshold voltages corresponds to a difference of current flow of 100 ma and the predetermined number of previous alternating current cycles is 2.

11. A ground fault current interrupter (GFCI) circuit, comprising:

a plurality of comparators, each of the comparators configured to compare a threshold voltage to a signal representative of a difference of current flow to a load and current flow from the load;

threshold generation circuitry configured to generate a plurality of different threshold voltages, each of the different threshold voltages provided as the threshold voltage for one of the comparators;

a plurality of timer circuits, each of the timer circuits comprising:

a filter counter coupled to one the comparators, the filter counter configured to activate a filter output signal responsive to the output of the comparator being active for longer that a predetermined time;

wherein the predetermined time increases with lower values of the threshold voltage;

a phase counter coupled to the filter counter, the phase counter configured to trigger a fault signal based on the filter output signal being active in more than half of a predetermined number of previous alternating current cycles.

12. The GFCI circuit of claim 11, wherein the predetermined number increases with lower values of the threshold voltage.

13. The GFCI circuit of claim 11, further comprising an amplifier comprising an output coupled each of the comparators.

14. The GFCI of circuit claim 11, further comprising switch control circuitry configured to open a switch to disable current flow to the load responsive to activation of the fault signal.

* * * * *